United States Patent
Chen et al.

(10) Patent No.: US 11,201,287 B2
(45) Date of Patent: Dec. 14, 2021

(54) PREPARING METHOD OF QUANTUM DOT FILM

(71) Applicant: TCL China Star Optoelectronics Technology Co., Ltd., Shenzhen (CN)

(72) Inventors: Lixuan Chen, Shenzhen (CN); Jinyang Zhao, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 182 days.

(21) Appl. No.: 16/623,405

(22) PCT Filed: Nov. 15, 2019

(86) PCT No.: PCT/CN2019/118905
§ 371 (c)(1),
(2) Date: Dec. 17, 2019

(87) PCT Pub. No.: WO2021/042567
PCT Pub. Date: Mar. 11, 2021

(65) Prior Publication Data
US 2021/0336143 A1   Oct. 28, 2021

(30) Foreign Application Priority Data

Sep. 4, 2019   (CN) .......................... 201910832171.3

(51) Int. Cl.
| | |
|---|---|
| *H01L 51/00* | (2006.01) |
| *H01L 51/56* | (2006.01) |
| *H01L 51/50* | (2006.01) |

(52) U.S. Cl.
CPC ........ *H01L 51/0006* (2013.01); *H01L 51/502* (2013.01); *H01L 51/56* (2013.01)

(58) Field of Classification Search
CPC .... H01L 51/0006; H01L 51/502; H01L 51/56
See application file for complete search history.

(56) References Cited

U.S. PATENT DOCUMENTS

2019/0334107 A1* 10/2019 Lee ..................... H01L 51/5253

FOREIGN PATENT DOCUMENTS

| CN | 102431964 | 5/2012 |
|---|---|---|
| CN | 105280833 | 1/2016 |
| CN | 198658820 | 4/2019 |

* cited by examiner

*Primary Examiner* — Anthony Ho

(57) ABSTRACT

A preparing method of a quantum dot film is provided. The method includes steps of: providing an electrode layer, the electrode layer including a plurality of strip electrodes spaced apart from each other; coating a quantum dot solution onto the electrode layer; supplying a driving voltage to the strip electrode to cause the quantum dots of the quantum dot solution to aggregate toward a region corresponding to the strip electrode; and curing an aggregated quantum dot solution to obtain the quantum dot film.

20 Claims, 2 Drawing Sheets

PREPARING METHOD OF QUANTUM DOT FILM

RELATED APPLICATIONS

This application is a National Phase of PCT Patent Application No. PCT/CN2019/118905 having International filing date of Nov. 15, 2019, which claims the benefit of priority of Chinese Patent Application No. 201910832171.3 filed on Sep. 4, 2019. The contents of the above applications are all incorporated by reference as if fully set forth herein in their entirety.

FIELD AND BACKGROUND OF THE INVENTION

The present invention relates to fields of display technology, and in particular to preparing methods of quantum dot films.

Quantum dot display technology has advantages in color gamut coverage, color control accuracy, and red, green and blue color purity, etc. It can realize wide color gamut display and restore image color realistically.

Quantum dots are semiconductor nanocrystals with radiuses less than or close to a Bohr radius, and are three-dimensional size nanomaterials mostly composed of groups II-VI or groups III-V elements. Due to the quantum confinement effect, transport of electrons and holes inside quantum dots is limited, so that a continuous band structure becomes a separate energy level structure. When sizes of quantum dots are different, quantum confinement degrees of electrons and holes are different, and discrete energy levels are different. After being excited by external energy, different sizes of quantum dots emit light with different wavelengths, that is, light with various colors.

Advantages of the quantum dots are that: by adjusting sizes of the quantum dots, an emission wavelength range covering the infrared light band and the entire visible light band can be achieved, the emission light band is narrow, and the color saturation is high. Quantum dot materials have high quantum conversion efficiency, and the material property is stable.

Technical problem: Currently, quantum dot films are prepared by photolithographic processes. However, the photolithographic processes reduce the stability of the quantum dots due to the need to undergo exposure and development processes.

Therefore, it is necessary to provide a preparing method of a quantum dot film to solve the problems existed in the prior art.

SUMMARY OF THE INVENTION

Technical solution: An object of the present invention is to provide a preparing method of a quantum dot film, which can improve the stability of quantum dots and further improve the display effect.

In order to solve the above-mentioned technical problems, the present invention provides a preparing method of a quantum dot film, including steps of:

providing an electrode layer, the electrode layer including a plurality of strip electrodes spaced apart from each other; wherein the strip electrode is at least corresponding to at least one sub-pixel of a pixel column with a same color in a display panel, and the strip electrodes have a same width;

coating a quantum dot solution onto the electrode layer; wherein the quantum dot solution has a plurality of quantum dots;

supplying a driving voltage to the strip electrode to cause the quantum dots of the quantum dot solution to aggregate to a region corresponding to the strip electrode; wherein a polarity of the driving voltage is opposite to a polarity of the quantum dots; and a degree of aggregation of the quantum dots is proportional to a level of the driving voltage; and curing an aggregated quantum dot solution to obtain the quantum dot film, wherein the quantum dot film includes a plurality of light-emitting columns, and positions of the light-emitting columns correspond to positions of the strip electrodes.

The present invention further provides a preparing method of a quantum dot film, including steps of:

providing an electrode layer, the electrode layer including a plurality of strip electrodes spaced apart from each other; wherein the strip electrode is at least corresponding to at least one sub-pixel of a pixel column with a same color in a display panel;

coating a quantum dot solution onto the electrode layer; the quantum dot solution has a plurality of quantum dots;

supplying a driving voltage to the strip electrode to cause the quantum dots of the quantum dot solution to aggregate to a region corresponding to the strip electrode; wherein a polarity of the driving voltage is opposite to a polarity of the quantum dots; and curing an aggregated quantum dot solution to obtain the quantum dot film, wherein the quantum dot film includes a plurality of light-emitting columns, and positions of the light-emitting columns correspond to positions of the strip electrodes.

Beneficial effect: a preparing method of a quantum dot film according the present invention, including steps of: providing an electrode layer, the electrode layer including a plurality of strip electrodes spaced apart from each other; coating a quantum dot solution onto the electrode layer; wherein the quantum dot solution has a plurality of quantum dots; supplying a driving voltage to the strip electrode to cause the quantum dots of the quantum dot solution to aggregate toward a region corresponding to the strip electrode; wherein a polarity of the driving voltage is opposite to a polarity of the quantum dots; and curing an aggregated quantum dot solution to obtain the quantum dot film, wherein the quantum dot film includes a plurality of light-emitting columns, and positions of the light-emitting columns correspond to positions of the strip electrodes. Because the quantum dot solution is patterned by applying the electric field to drive the quantum dot solution, damage to quantum dots can be avoided, thereby improving the stability of quantum dots, and improving the display effect.

DESCRIPTION OF SPECIFIC EMBODIMENTS OF THE INVENTION

Figure 1:
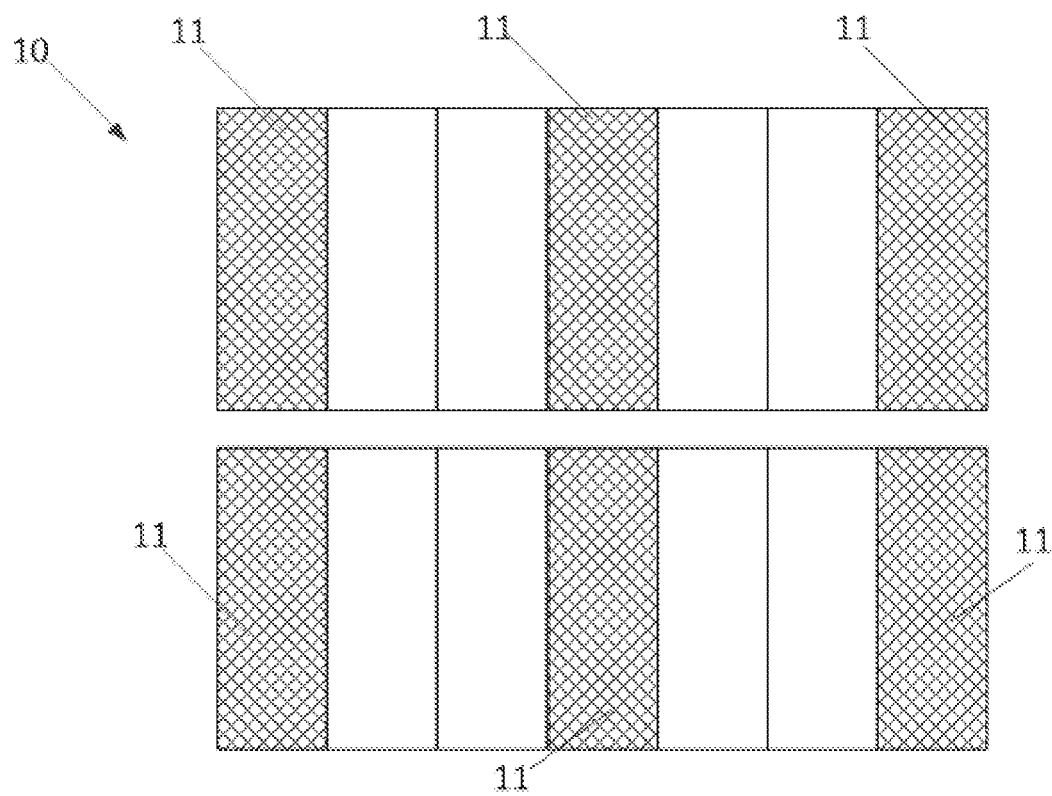
FIG. 1 is a first plan view of an electrode layer according to the present invention.

The following description of the various embodiments is provided to illustrate the specific embodiments of the invention. The directional terms mentioned in the present invention, such as "upper", "lower", "front", "rear", "left", "right", "inside", "outside", "side", etc., are merely refer to the direction of the accompanying drawing. Therefore, the directional terminology used is for the purpose of illustration and understanding of the invention. In the figures, structurally similar elements are denoted by the same reference numerals.

Figure 2:
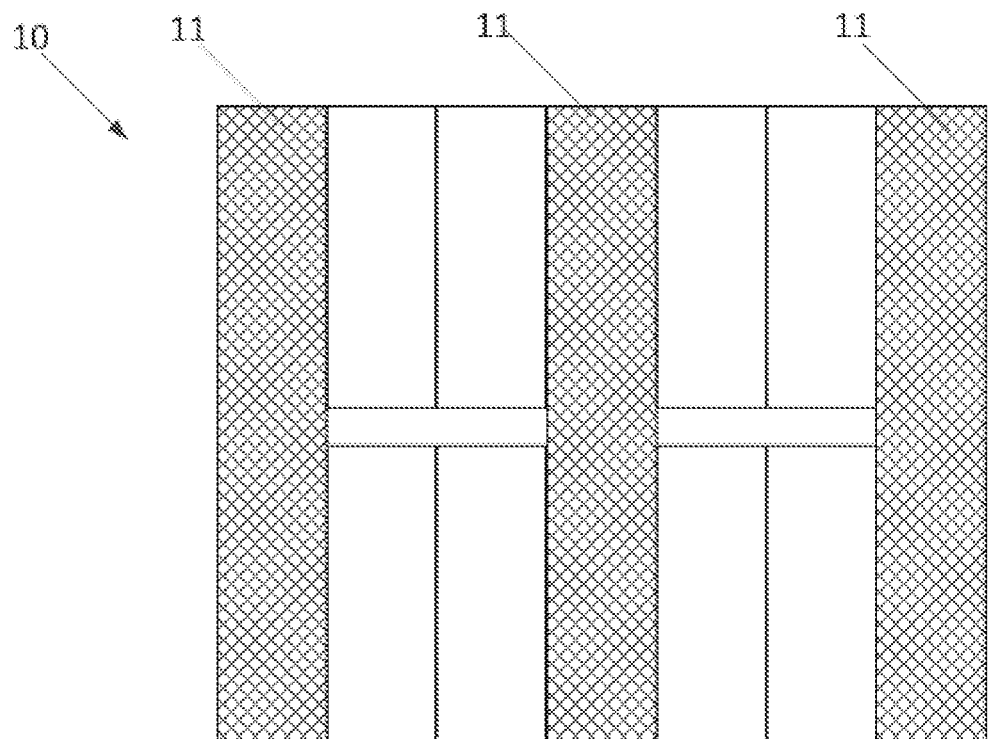
FIG. 2 is a second plan view of an electrode layer according to the present invention.

Referring to FIG. 1 to FIG. 2, FIG. 1 is a schematic structural view of an electrode layer according to the present invention.

A preparing method of a quantum dot film of this embodiment includes the following steps:

In a step of S101, providing an electrode layer, the electrode layer including a plurality of strip electrodes spaced apart from each other.

For example, as shown in FIG. 1, an electrode layer 10 is prepared in advance, and the electrode layer 10 includes a plurality of strip electrodes 11 spaced apart from each other. A display panel includes a plurality of pixel columns, and colors of the adjacent two pixel columns are different. That is, pixels in a same column have a same color. For example, the display panel includes a red pixel column, a blue pixel column, and a green pixel column. The electrode layer 10 may be a transparent electrode layer, and material of the electrode layer 10 is, for example, indium tin oxide.

As shown in FIG. 1, the strip electrode 11 may correspond to at least one sub-pixel of a pixel column with a same color in the display panel. That is, the strip electrode at least covers a sub-pixel of the corresponding color of the pixel column. Certainly, as shown in FIG. 2, the strip electrodes 11 may also correspond to pixel columns with the same color in the display panel. That is, the strip electrodes 11 correspond to the corresponding color of pixel columns. It can be understood that the strip electrode 11 can also correspond to at least two sub-pixels in a pixel column with the same color. That is, the strip electrode corresponds to at least two sub-pixels of the corresponding color of the pixel column.

In order to improve the uniformity of brightness, the strip electrodes 11 have a same width. A pitch between two adjacent strip electrodes 11 in the same row is equal.

In a step of S102, coating a quantum dot solution onto the electrode layer;

For example, a quantum dot solution is coated on the electrode layer 10. In an embodiment, the quantum dot solution is formed by uniformly dispersing quantum dots in an organic solvent. It can be understood that the quantum dot solution may also be other quantum dot solutions, such as a perovskite quantum dot solution.

Figure 3:
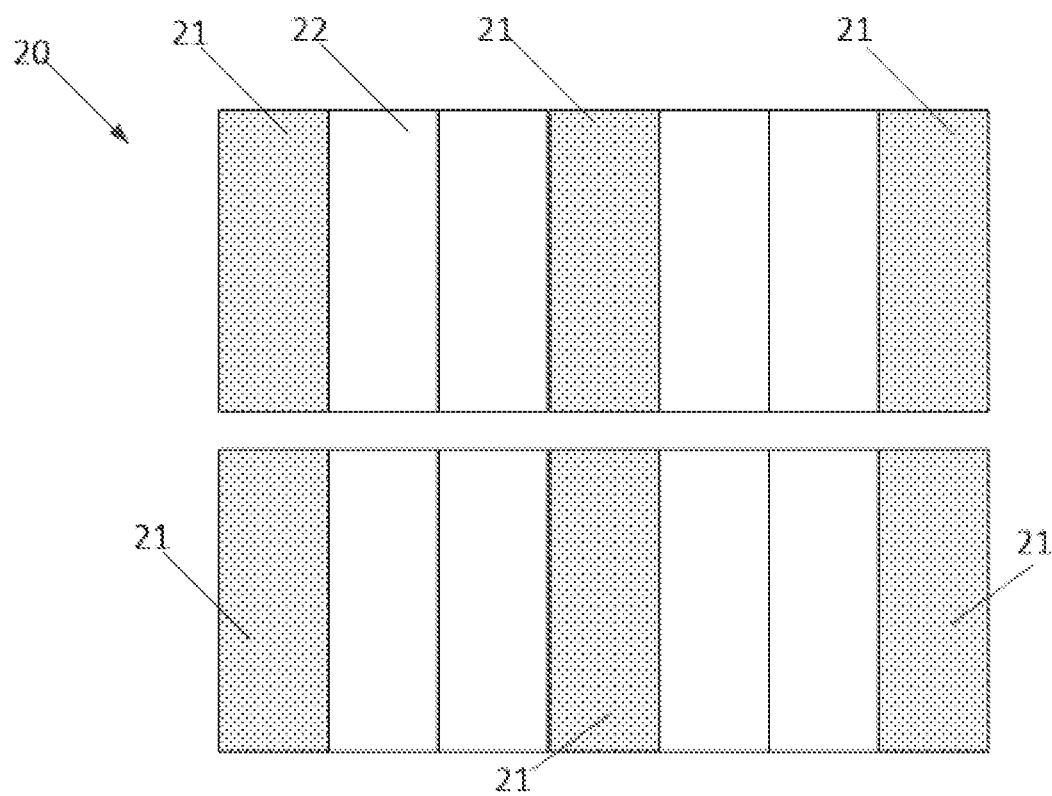
FIG. 3 is a plan view of a quantum dot film corresponding to FIG. 1 of the present invention.

In a step of S103, supplying a driving voltage to the strip electrode to cause the quantum dots of the quantum dot solution to aggregate to a region corresponding to the strip electrode;

For example, as shown in FIG. 3, a driving voltage is supplied to the strip electrode 11, so that the quantum dots in the quantum dot solution are aggregated toward a region corresponding to the strip electrode 11. A degree of aggregation of the quantum dots is proportional to a level of the driving voltage. The degree of aggregation also refers to a degree of gathering. In an embodiment, the driving voltage may be a direct current voltage, and the supplying time of the direct current voltage can be set according to experience. A polarity of the driving voltage is opposite to a polarity of the quantum dots.

In an embodiment, in order to further increase the degree of aggregation of the quantum dots, the driving voltage has a magnitude range being from 1 V to 100 V.

In a step of S104, curing an aggregated quantum dot solution to obtain the quantum dot film.

For example, as shown in FIGS. 1 and 3, in an embodiment, the step may specifically include curing the aggregated quantum dot solution by an ultraviolet light or heating.

The quantum dot film 20 includes a plurality of light-emitting columns 21, and positions of the light-emitting columns 21 corresponds to positions of the strip electrodes 11. The quantum dot film further includes a plurality of non-light-emitting columns, and each of the non-light-emitting column is disposed between the two adjacent light-emitting columns. The quantum dot film according to the present embodiment can be used for manufacturing organic light emitting diodes, and specifically for forming an organic light emitting layer. That is, material of the organic light emitting layer can be a quantum dot film. It can be understood that the quantum dot film corresponding to FIG. 2 is similar.

The present invention also provides a preparing method of a quantum dot film. The difference between the preparing method of the quantum dot film of the present embodiment and the previous embodiment is that: in this embodiment, after the step of curing the aggregated quantum dot solution, the method further includes the following step:

In a step of S105, removing the electrode layer under the quantum dot film.

Figure 4:
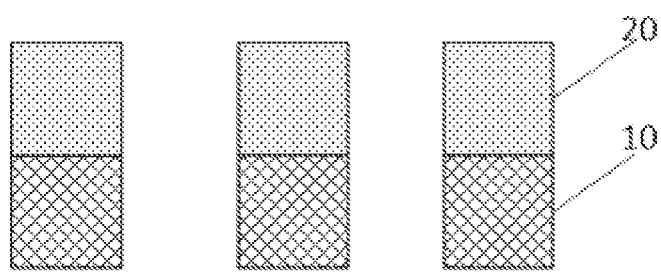
FIG. 4 is a schematic structural view of a fourth step of a preparing method of a quantum dot film according to the present invention.

For example, in conjunction with FIG. 4, the electrode layer of the present embodiment is a non-transparent electrode layer, and the electrode layer 10 under the quantum dot film 20 is peeled off in order to improve the light transmission effect.

It can be understood that this step can also be applied to the first embodiment to reduce a thickness of the quantum dot film, thereby reducing an overall thickness of the display panel.

Due to the driving voltage applied to the electrode layer, the quantum dot solution is aggregated under driving of the electric field. That is, the patterning process is autonomously performed, thereby avoiding damage to the quantum dots, so as to improve the stability of the quantum dots, and further improve the display effect.

A preparing method of a quantum dot film according the present invention, including steps of: providing an electrode layer, the electrode layer including a plurality of strip electrodes spaced apart from each other; coating a quantum dot solution onto the electrode layer; wherein the quantum dot solution has a plurality of quantum dots; supplying a driving voltage to the strip electrode to cause the quantum dots of the quantum dot solution to aggregate toward a region corresponding to the strip electrode; wherein a polarity of the driving voltage is opposite to a polarity of the quantum dots; and curing an aggregated quantum dot solution to obtain the quantum dot film, wherein the quantum dot film includes a plurality of light-emitting columns, and positions of the light-emitting columns correspond to positions of the strip electrodes. Because the quantum dot solution is patterned by applying the electric field to drive the quantum dot solution, damage to quantum dots can be avoided, thereby improving the stability of quantum dots, and improving the display effect.

In summary, the present invention has been disclosed in the above preferred embodiments, but the preferred embodiments are not intended to limit the present invention, those skilled in the art can make various modifications and retouch without departing from the spirit and scope of the invention, and the scope of the invention is defined by the scope defined by the claims.

The invention claimed is:

1. A preparing method of a quantum dot film, comprising steps of:
    providing an electrode layer, the electrode layer comprising a plurality of strip electrodes spaced apart from each other; wherein the strip electrode is at least corresponding to at least one sub-pixel of a pixel column with a same color in a display panel, and the strip electrodes have a same width;
    coating a quantum dot solution onto the electrode layer; wherein the quantum dot solution has a plurality of quantum dots;
    supplying a driving voltage to the strip electrode to cause the quantum dots of the quantum dot solution to aggregate to a region corresponding to the strip electrode;
    wherein a polarity of the driving voltage is opposite to a polarity of the quantum dots; and a degree of aggregation of the quantum dots is proportional to a level of the driving voltage; and
    curing an aggregated quantum dot solution to obtain the quantum dot film, wherein the quantum dot film includes a plurality of light-emitting columns, and positions of the light-emitting columns correspond to positions of the strip electrodes.

2. The preparing method of the quantum dot film according to claim 1, wherein the strip electrodes correspond to pixel columns with the same color in the display panel.

3. The preparing method of the quantum dot film according to claim 1, wherein the quantum dot film further comprises a plurality of non-light-emitting columns, wherein the non-light-emitting column is disposed between the two light-emitting columns adjacent to each other.

4. The preparing method of the quantum dot film according to claim 1, wherein the driving voltage has a magnitude range being from 1 V to 100 V.

5. The preparing method of the quantum dot film according to claim 1, wherein after the step of curing the aggregated quantum dot solution, the method further comprises a step of: removing the electrode layer under the quantum dot film.

6. The preparing method of the quantum dot film according to claim 1, wherein the electrode layer is a transparent electrode layer or a non-transparent electrode layer.

7. The preparing method of the quantum dot film according to claim 1, wherein the step of curing the aggregated quantum dot solution comprises a step of: curing the aggregated quantum dot solution by an ultraviolet light or heating.

8. The preparing method of the quantum dot film according to claim 1, wherein the quantum dot film is used to form an organic light-emitting layer.

9. The preparing method of the quantum dot film according to claim 1, wherein the quantum dot solution is a perovskite quantum dot solution.

10. A preparing method of a quantum dot film, comprising steps of:
    providing an electrode layer, the electrode layer comprising a plurality of strip electrodes spaced apart from each other; wherein the strip electrode is at least corresponding to at least one sub-pixel of a pixel column with a same color in a display panel;
    coating a quantum dot solution onto the electrode layer; the quantum dot solution has a plurality of quantum dots;
    supplying a driving voltage to the strip electrode to cause the quantum dots of the quantum dot solution to aggregate to a region corresponding to the strip electrode;
    wherein a polarity of the driving voltage is opposite to a polarity of the quantum dots; and
    curing an aggregated quantum dot solution to obtain the quantum dot film, wherein the quantum dot film includes a plurality of light-emitting columns, and positions of the light-emitting columns correspond to positions of the strip electrodes.

11. The preparing method of the quantum dot film according to claim 10, wherein the strip electrodes correspond to pixel columns with the same color in the display panel.

12. The preparing method of the quantum dot film according to claim 10, wherein the strip electrodes have a same width.

13. The preparing method of the quantum dot film according to claim 10, wherein a degree of aggregation of the quantum dots is proportional to a level of the driving voltage.

14. The preparing method of the quantum dot film according to claim 10, wherein the quantum dot film further comprises a plurality of non-light-emitting columns, wherein the non-light-emitting column is disposed between the two light-emitting columns adjacent to each other.

15. The preparing method of the quantum dot film according to claim 10, wherein the driving voltage has a magnitude range being from 1 V to 100 V.

16. The preparing method of the quantum dot film according to claim 10, wherein after the step of curing the aggregated quantum dot solution, the method further comprises a step of: removing the electrode layer under the quantum dot film.

17. The preparing method of the quantum dot film according to claim 10, wherein the electrode layer is a transparent electrode layer or a non-transparent electrode layer.

18. The preparing method of the quantum dot film according to claim 10, wherein the step of curing the aggregated quantum dot solution comprises a step of: curing the aggregated quantum dot solution by an ultraviolet light or heating.

19. The preparing method of the quantum dot film according to claim 10, wherein the quantum dot film is used to form an organic light-emitting layer.

20. The preparing method of the quantum dot film according to claim 10, wherein the quantum dot solution is a perovskite quantum dot solution.

* * * * *